(12) United States Patent
Dropmann et al.

(10) Patent No.: US 7,863,699 B2
(45) Date of Patent: Jan. 4, 2011

(54) BONDED WAFER PACKAGE MODULE

(75) Inventors: Hans Dropmann, Emerald Hills, CA (US); Uppili Sridhar, Plano, TX (US); Carlton Stuebing, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 357 days.

(21) Appl. No.: 12/124,925

(22) Filed: May 21, 2008

(65) Prior Publication Data

US 2009/0289722 A1 Nov. 26, 2009

(51) Int. Cl.
*G01R 33/09* (2006.01)

(52) U.S. Cl. .............................. 257/416; 257/E25.027; 257/254; 257/531; 257/686; 257/777; 333/133; 333/187; 333/189; 333/191; 438/50; 438/52

(58) Field of Classification Search .......... 257/E25.027, 257/E23.128, E23.193, 2, 4, 254, 416, 531, 257/686, 685, 723, 777; 333/133, 187–192, 333/322, 324; 330/303; 607/32, 60; 438/50, 438/52, 53, 107, 109, 110
See application file for complete search history.

(56) References Cited

U.S. PATENT DOCUMENTS

| 6,097,096 | A | * | 8/2000 | Gardner et al. .............. 257/777 |
| 6,384,353 | B1 | * | 5/2002 | Huang et al. ................. 200/181 |
| 6,673,697 | B2 | * | 1/2004 | Ma et al. ...................... 438/455 |
| 6,713,314 | B2 | * | 3/2004 | Wong et al. .................... 438/25 |
| 7,061,099 | B2 | * | 6/2006 | Lu et al. ....................... 257/704 |
| 7,102,224 | B2 | * | 9/2006 | Pahl .............................. 257/704 |
| 7,183,622 | B2 | * | 2/2007 | Heck et al. ................... 257/528 |
| 7,232,708 | B2 | * | 6/2007 | Morkner ....................... 438/109 |
| 7,344,901 | B2 | * | 3/2008 | Hawtof et al. ................. 438/26 |
| 7,368,816 | B2 | * | 5/2008 | Lim et al. ..................... 257/710 |
| 7,378,922 | B2 | * | 5/2008 | Kubo et al. ................... 333/189 |
| 7,476,567 | B2 | * | 1/2009 | Sato ............................. 438/110 |
| 7,615,842 | B2 | * | 11/2009 | Lee et al. ...................... 257/531 |
| 7,629,201 | B2 | * | 12/2009 | Gan et al. ..................... 438/106 |
| 2007/0012655 | A1 | * | 1/2007 | Kwon et al. ................... 216/13 |
| 2007/0182510 | A1 | | 8/2007 | Park et al. |

* cited by examiner

*Primary Examiner*—Chris Chu
(74) *Attorney, Agent, or Firm*—Blakely Sokoloff Taylor & Zafman LLP (57) ABSTRACT

Bonded wafer packages having first and second wafers bonded together forming a matrix of sealed devices, at least one of the wafers having a plurality of passive devices formed thereon, including at least one BAW resonator within each of the sealed devices, the first wafer having conductor filled through-holes forming electrical connections between the passive devices and connections assessable from outside the sealed devices, the bonded wafers being diced to form individual sealed devices. The devices may be duplexers, interstage filters or other circuits such as VCOs and RF circuits. Various embodiments are disclosed.

38 Claims, 12 Drawing Sheets

BONDED WAFER PACKAGE MODULE

BACKGROUND OF THE INVENTION

1. Field of the Invention

The present invention relates to the field of bulk acoustic wave resonators and semiconductor packaging.

2. Prior Art

Figure 1:
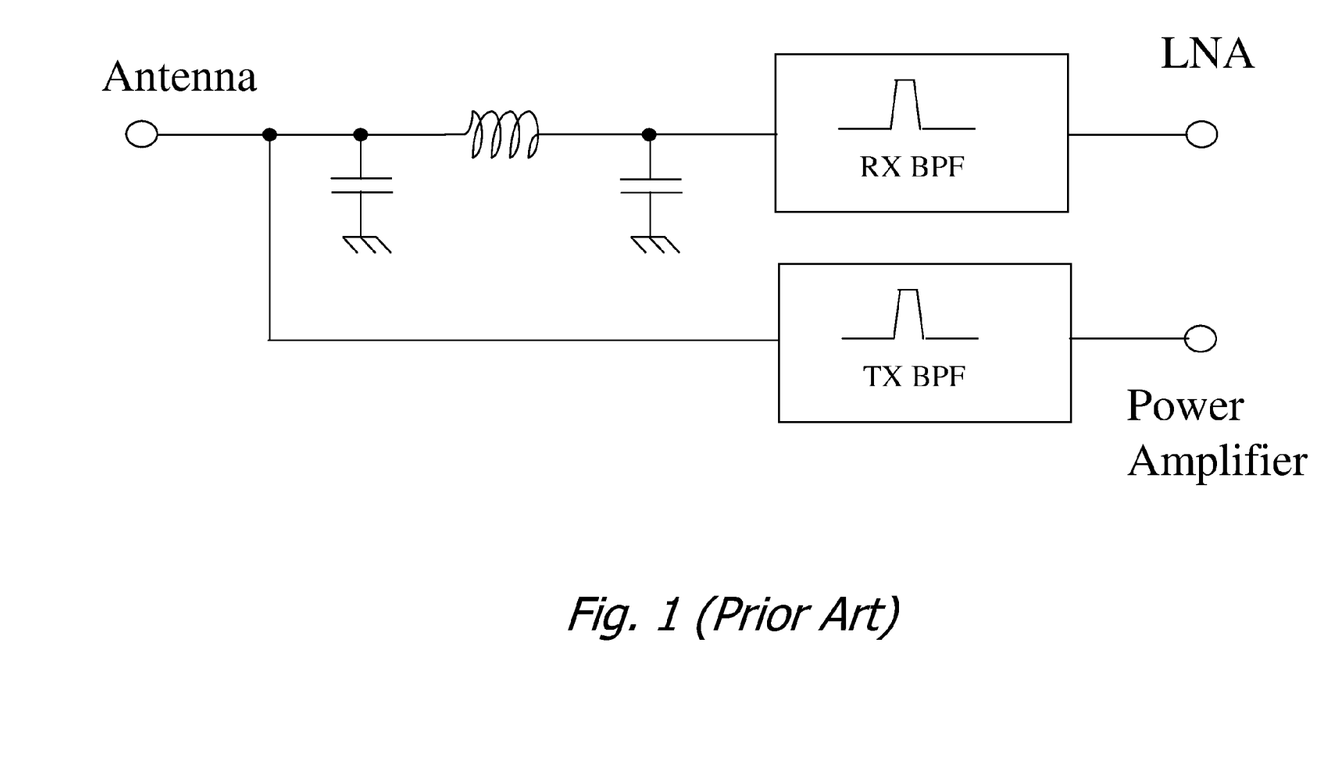
FIG. 1 is a simplified schematic example of a combiner on bonded resonator wafers.
Figure 2:
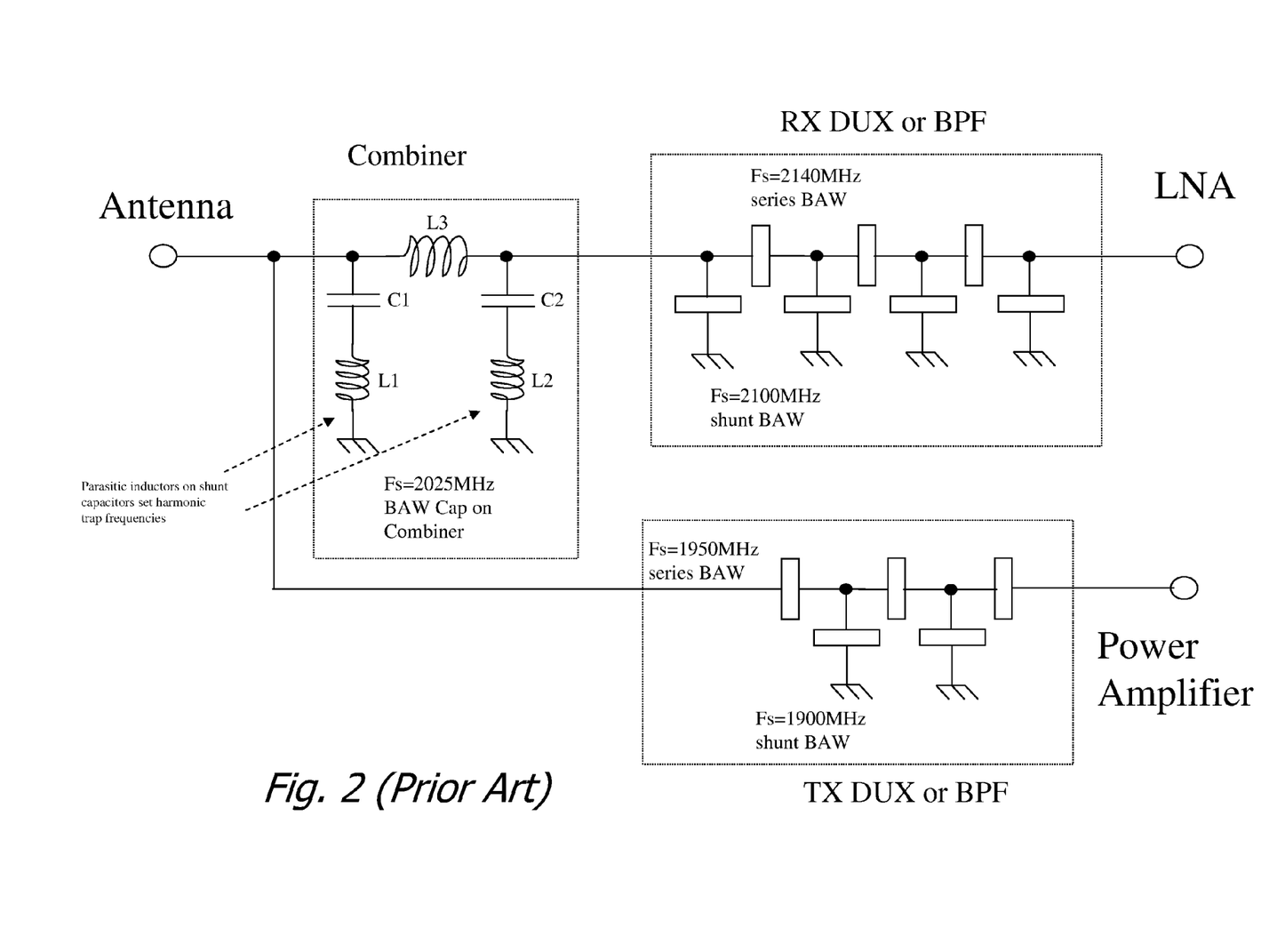
FIG. 2 is a more detailed schematic example of a combiner on bonded resonator wafers.

A prior art duplexer consists of a land grid array package, a combiner circuit, and two BAW die (one side resonator, one side cap). Additionally, in the duplexer application, a required combiner means typically consists of a "π" configuration or shunt capacitor, series inductor and shunt capacitor implemented using discrete devices such as "0201" surface mount devices or transmission line techniques. A typical combiner circuit is shown in FIG. 1, with a more detailed schematic shown in FIG. 2. FIG. 2 also illustrates the three devices in the prior art land grid array package, namely a combiner circuit, and two BAW die, each with one side resonator, one side cap.

DETAILED DESCRIPTION OF THE PREFERRED EMBODIMENTS

One preferred embodiment of the present invention replaces the prior art module with one side of a bonded wafer acting as the RX resonator die (typically having higher Fs and Fp frequency pairs). One side of the bonded wafer would provide through hole vias to connect electrical signals to the circuit board with solder ball or wire bond technology. Both sides of the bonded wafer may have resonators in their respective circuits. The layouts of the RX and TX duplexer filters will allow extra room for cavities. These cavities will allow the resonators of the opposite wafer to interface with an air pocket instead of the substrate or metal runs of the complementary die. In this regard, RX and TX duplexer die will need to be physically larger than previous BAW duplexer ("DUX") technology.

Figure 3:
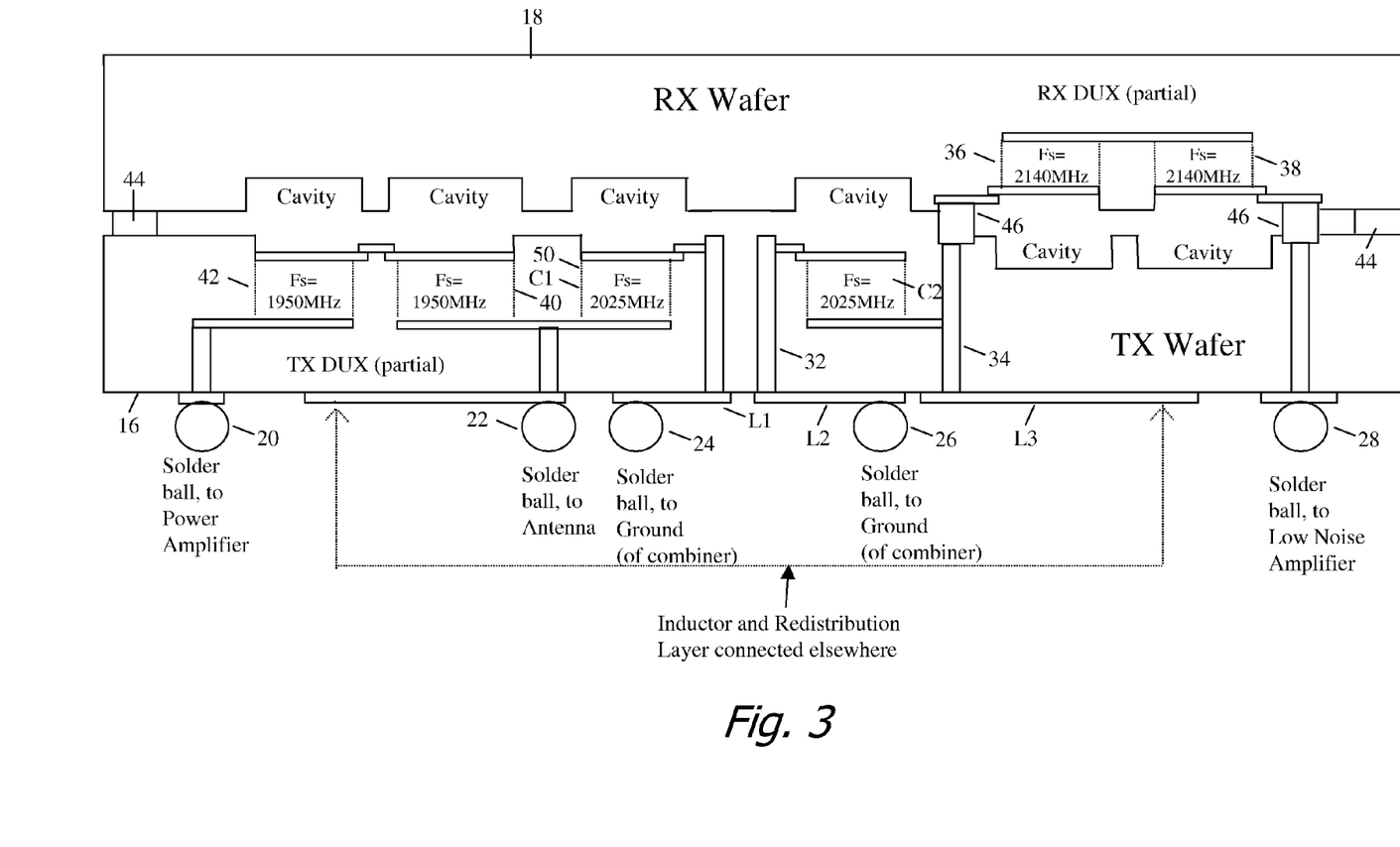
FIG. 3 is a cross-section example of a duplexer on bonded resonator wafers, together with vias, and resonators and cavities offset face to face.

Now referring to FIG. 3, one embodiment of the present invention may be seen. This embodiment includes a transmit wafer 16 and a receive wafer 18. Typically these wafers would use AlN in their resonators, though other materials might be used. In that regard, FIG. 3 shows the structure of a single packaged unit, though it is to be understood that in the preferred embodiment, wafer scale packaging is used to package an entire wafer array of units, with the wafers subsequently being diced to provide a plurality of individual units, each of the structures shown in FIG. 3.

As shown in FIG. 3, electrical contacts for both the transmit wafer and the receive wafer are brought out through conductor filled through-holes in the transmit wafer for solder ball or wire bond connection to a higher assembly. These contacts include contact 20 for coupling to a power amplifier (see FIG. 1), contact 22 for coupling to an antenna, contact 24 for coupling to ground, contact 26 for also coupling to ground, and contact 28 for coupling to a low noise amplifier.

The transmit and receive bandpass filters of FIG. 1 are included in this device. In particular, contact 20 is electrically connected to a bottom plate of a first resonator formed by a piezoelectric layer 42, such as AlN, with a top electrode and a top plate for electrically coupling to a top plate of a second series connected resonator, including piezoelectric layer 40 and bottom plate coupled to contact 22. In an exemplary embodiment, these resonators are tuned to 1950 MHz. Also electrically connected to the bottom plate is a dielectric layer 50 having a top plate and an interconnect layer electrically coupled to contact 24. This structure forms capacitor C1 of FIG. 2. In that regard, while various dielectric materials might be used, a preferred choice for processing convenience is to use the same piezoelectric material as used for the resonators, namely AlN. However, to assure that the structure acts as a capacitor and not as a resonator, the structure should be tuned (de-tuned) so as to not exhibit resonance in the frequency range of the transmitter or receiver. In the exemplary embodiment, a frequency is chosen between the transmit frequency range and the receive frequency range, namely 2025 MHz.

For the receive wafer 18, contact 34 is connected to the top plate of a first resonator comprising a piezoelectric layer 36 and bottom plate, with a second series connected resonator being formed by piezoelectric layer 38 electrically coupled through a bottom plate to contact 28. Also the second capacitor C2 is formed in the preferred embodiment on the transmit wafer 16 by using another layer of AlN, electrically coupled through conductor filled vias 32 and 34. The piezoelectric layer thereof, like capacitor C1 in the exemplary embodiment, is tuned to 2025 MHz between the transmit frequency range and the receive frequency range.

Also formed by conductive traces, typically a patterned metal layer, are inductors L1, L2 and L3 on an external surface of one of the wafers, typically on the surface with the external contacts. The inductors form the corresponding inductors of FIG. 2, which together with capacitors C1 and C2, form the full combiner of FIG. 2. The resonators, on the other hand, schematically represent the bandpass filters of FIGS. 1 and 2, complete filter circuits are not being shown for clarity.

As previously mentioned, a transmit wafer and a receive wafer, each having an array of devices thereon, are bonded and then diced. For this purpose a bonding ring matrix is used, forming a bonding ring 44 (FIG. 3) around each unit, sealing the edges of the transmit side and the receive side of each unit together. At the same time, contacts 46 electrically coupling the two wafers are bonded between the wafers.

Thus each unit of the transmit wafer includes a pair of series connected resonators, with one end of the series connection for coupling to the power amplifier and the other end for coupling to a combiner, and also includes a capacitor for capacitively coupling to a combiner ground. Each unit of the receive wafer includes a pair of series connected resonators, with one end of the series connection for coupling to the low noise amplifier and the other end for coupling to a combiner, and also includes a capacitor for capacitively coupling to a combiner ground. Note that each resonator has an associated cavity in the opposite substrate to reduce the effect of the opposite substrate on the resonator.

Figure 4:
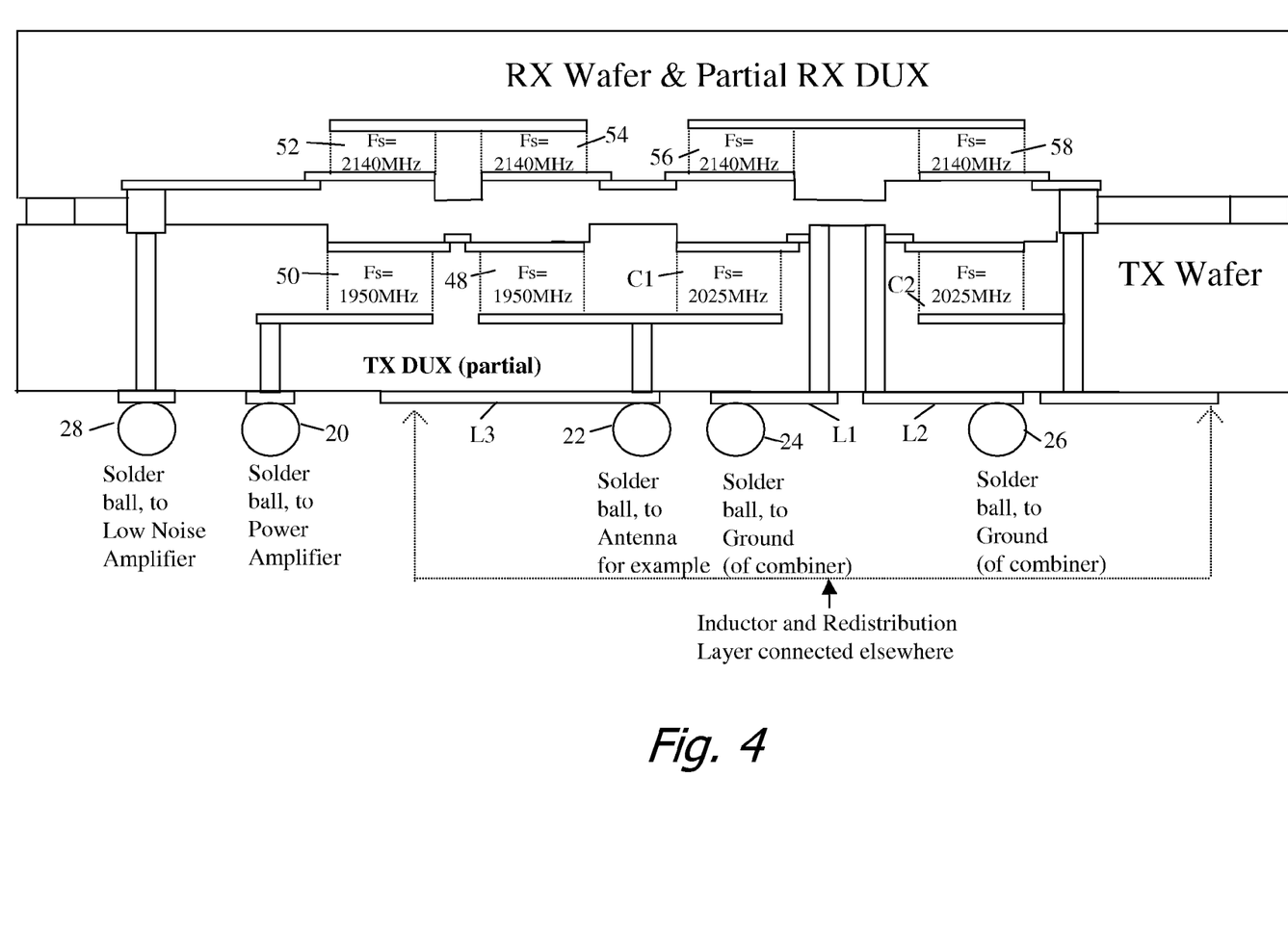
FIG. 4 is a cross-section example of a high density duplexer on bonded wafers, wherein resonator cavities are shared between RX and TX, using face to face resonators.

Now referring to FIG. 4, another embodiment of the present invention may be seen. This embodiment has the same contacts to the outside world, though relocated in accordance with the relocation of certain elements on the transmit and receive wafers. In particular, capacitors C1 and C2 are relocated with series connected resonators 48 and 50, forming one of a plurality of series and shunt resonators on the transmit wafer, to a position immediately opposite at least some of the resonators 52, 54, 56 and 58 on the receive wafer. Electrically this embodiment also realizes the combiner of FIG. 2 and schematically illustrates one of many resonators in the transmit and receive bandpass filters. The major difference in this embodiment is the fact that the resonators are placed face to face, or at least some of the resonators are face to face on opposing wafers.

Figure 5:
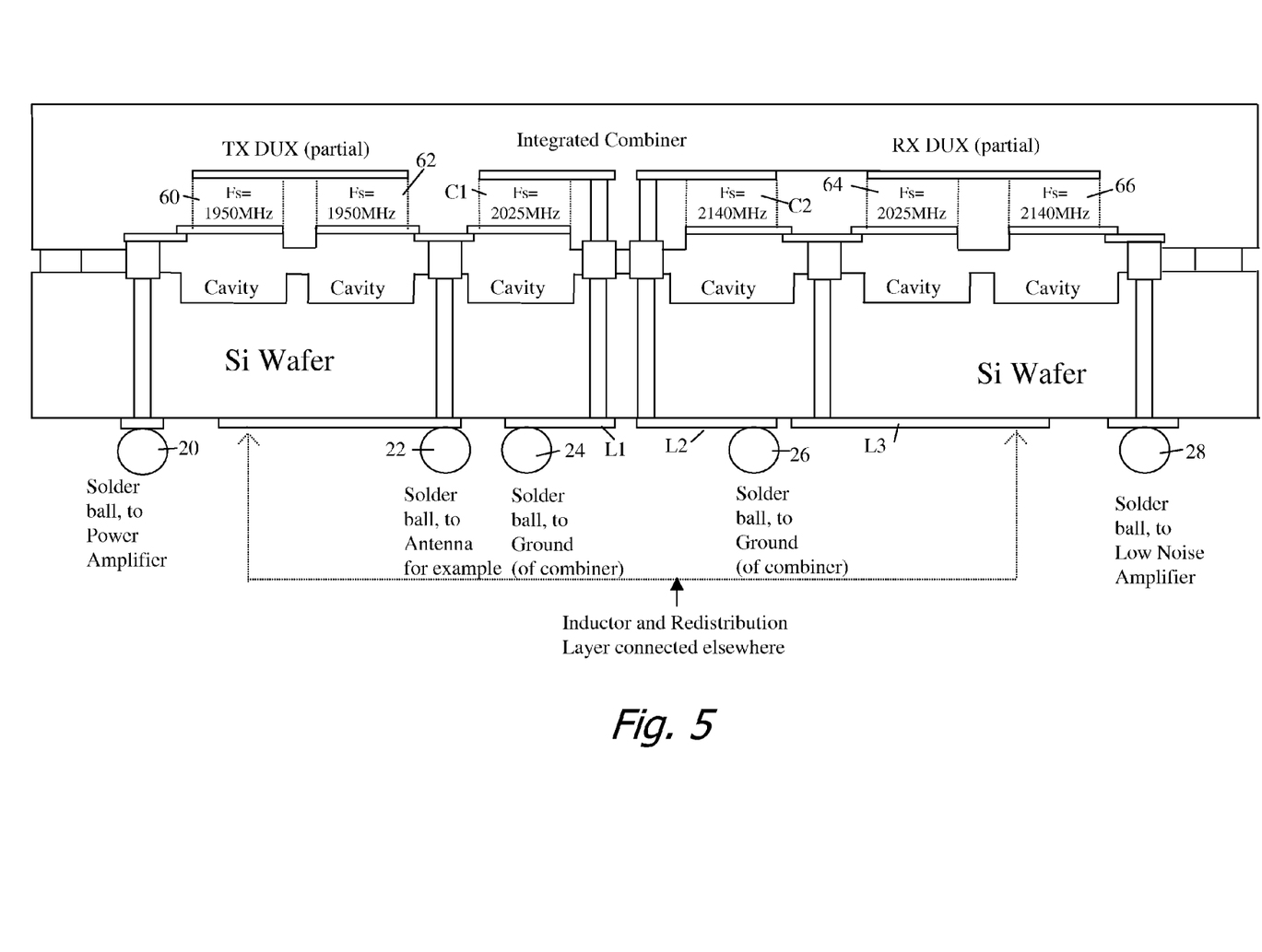
FIG. 5 is a cross-section example of a duplexer on bonded resonator wafers using one active wafer, one cap wafer.

The embodiment of FIG. 5 is similarly electrically the same as the earlier embodiment, the various contacts, inductors and capacitors being identified therein. In addition, however, the transmit bandpass filter and receive bandpass filter are all on the same wafer, schematically represented by resonators 60 and 62, and 64 and 66, respectively. Here the bottom wafer on which the inductors and contacts are located is preferably a silicon wafer having cavities adjacent to resonators on the upper wafer.

Figure 6:
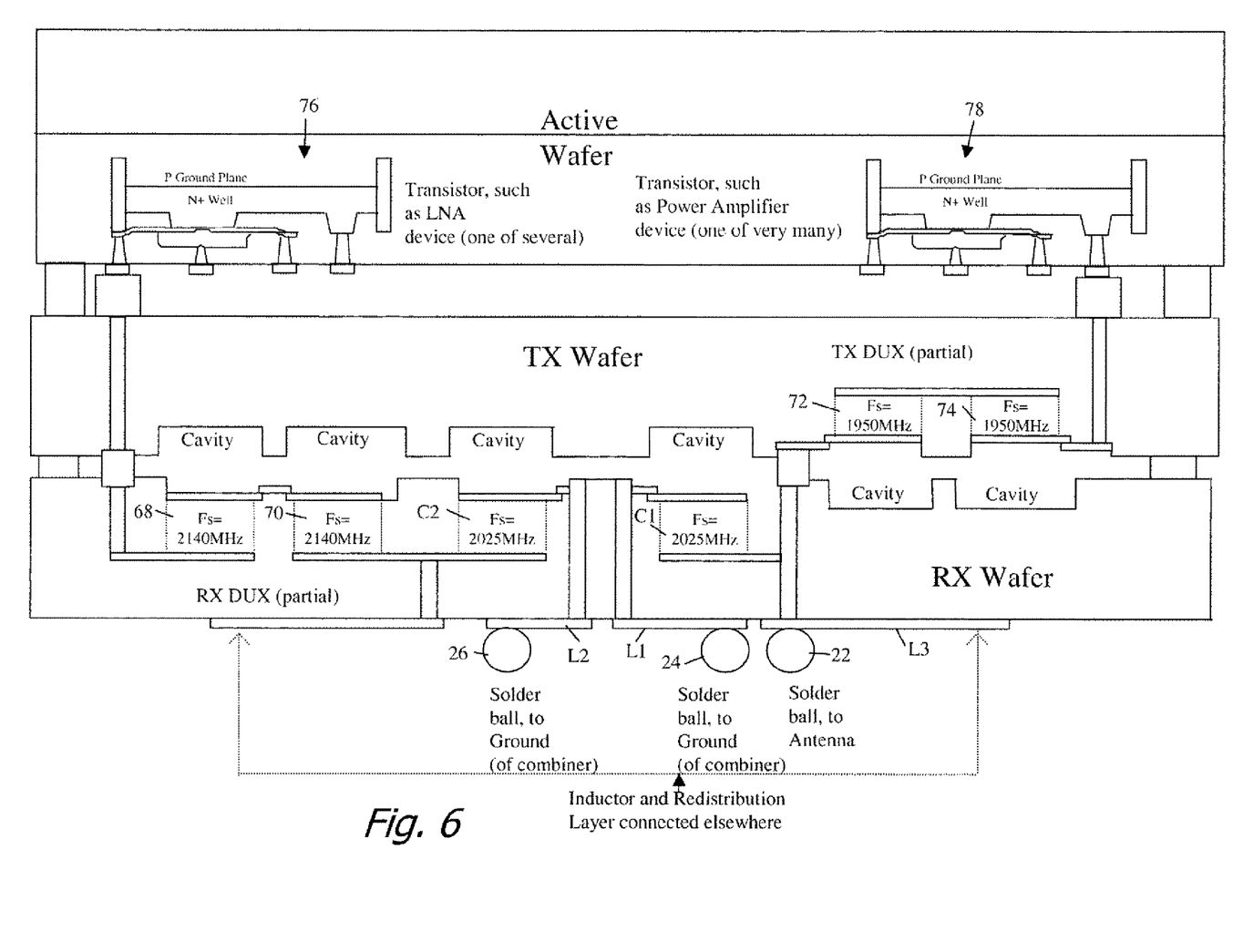
FIG. 6 is a cross-section example of a duplexer on bonded wafers plus an active wafer.

The embodiment of FIG. 6 is similar to the earlier embodiments in that as shown in the Figure, capacitors C1 and C2 and inductors L1, L2 and L3 are shown, as are contacts 22, 24 and 26. Further, representative resonators 68 and 70 are shown for the receive wafer, schematically showing the plurality of series and shunt resonators of the receive bandpass filter of FIG. 2, as are resonators 72 and 74, schematically representing the plurality of series and shunt resonators on the transmit wafer, again in accordance with FIG. 2. Further however, a third wafer has been added, specifically in this embodiment an active wafer which includes a low noise amplifier generally indicated by numeral 76, as well as an amplifier generally indicated by numeral 78. This wafer would preferably be a silicon wafer, though could be a gallium arsenide wafer, the output of low noise amplifier 76 and the input of power amplifier 78, as schematically shown in the Figure, being in a different plane from the cross-section presented. The circuitry for the low noise amplifier and for the power amplifier may be conventional bipolar, MOS or BiCMOS, by way of example. Obviously circuitry other than power amplifiers and LNAs such as mixers, VGAs, PGAs can also be implemented on the active wafer. Also the circuitry in this and other embodiments may comprise a multi-stage power amplifier whose individual gain stages connect to individual resonator stages to optimize system noise and filter loss.

Figure 7:
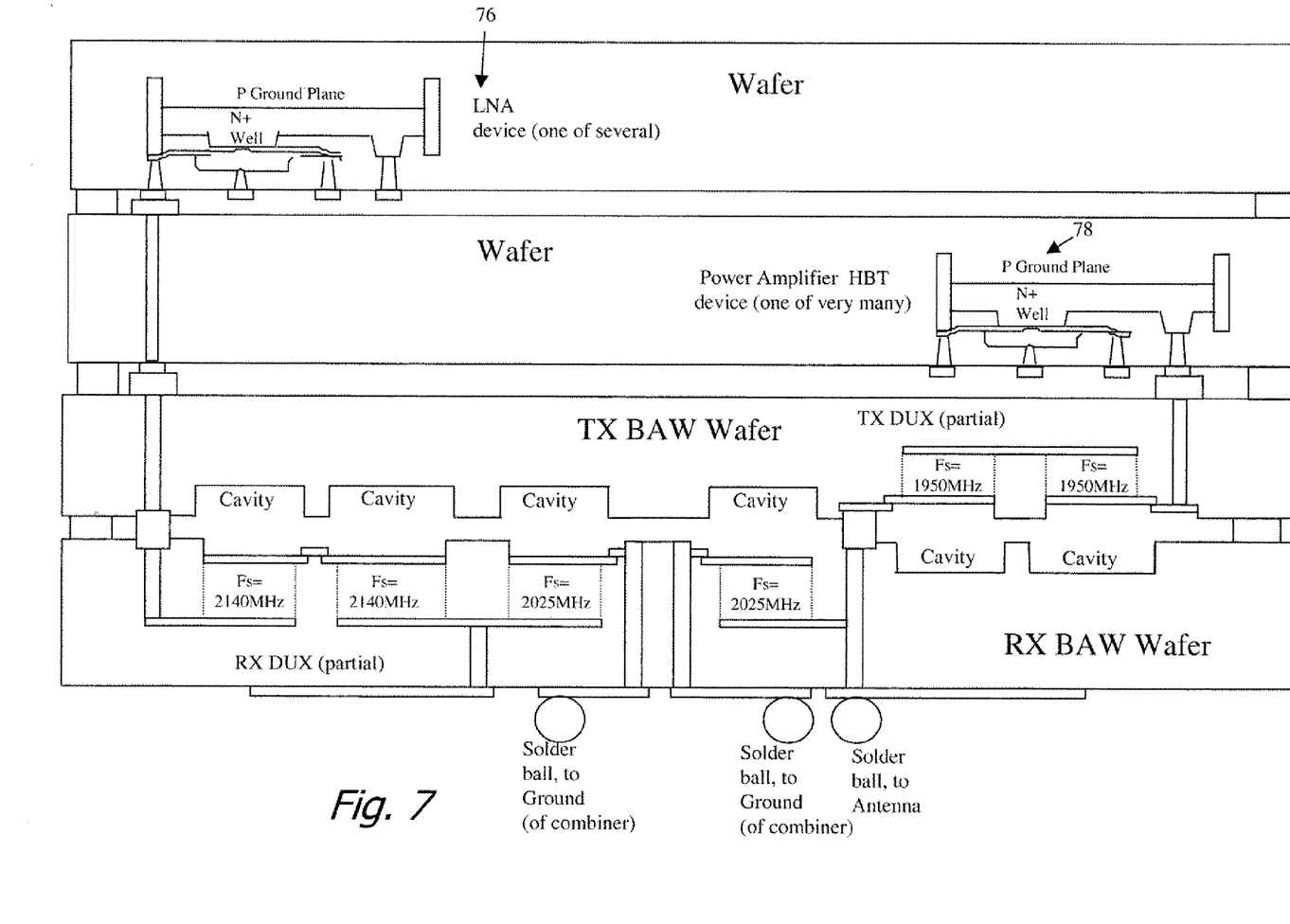
FIG. 7 is a cross-section example of a duplexer on bonded wafers plus a first wafer plus a second active wafer.

In the embodiment of FIG. 7, the receive wafer and the transmit wafer are shown in accordance with FIG. 6, though of course the same may be of a configuration of the earlier embodiment or still in a different organization, as desired. In this embodiment, however, a fourth wafer is added, specifically a gallium arsenide wafer, between the silicon wafer (BiCMOS wafer in the example) and a transmit wafer. The BiCMOS wafer in this embodiment has a low noise amplifier 76 thereon, whereas the gallium arsenide wafer has the power amplifier 78 thereon. Note, of course, that while a specific order of wafers is shown in the Figure, one might change the order so that the transmit wafer is the lower wafer with contacts and inductors thereon and the receive wafer is the second wafer, and that the BiCMOS wafer and gallium arsenide wafer are reversed in order. Such an arrangement would put the low noise amplifier closer to the output of the receive bandpass filter. Obviously this and other variations may also readily be made by those skilled in the art.

Figure 8:
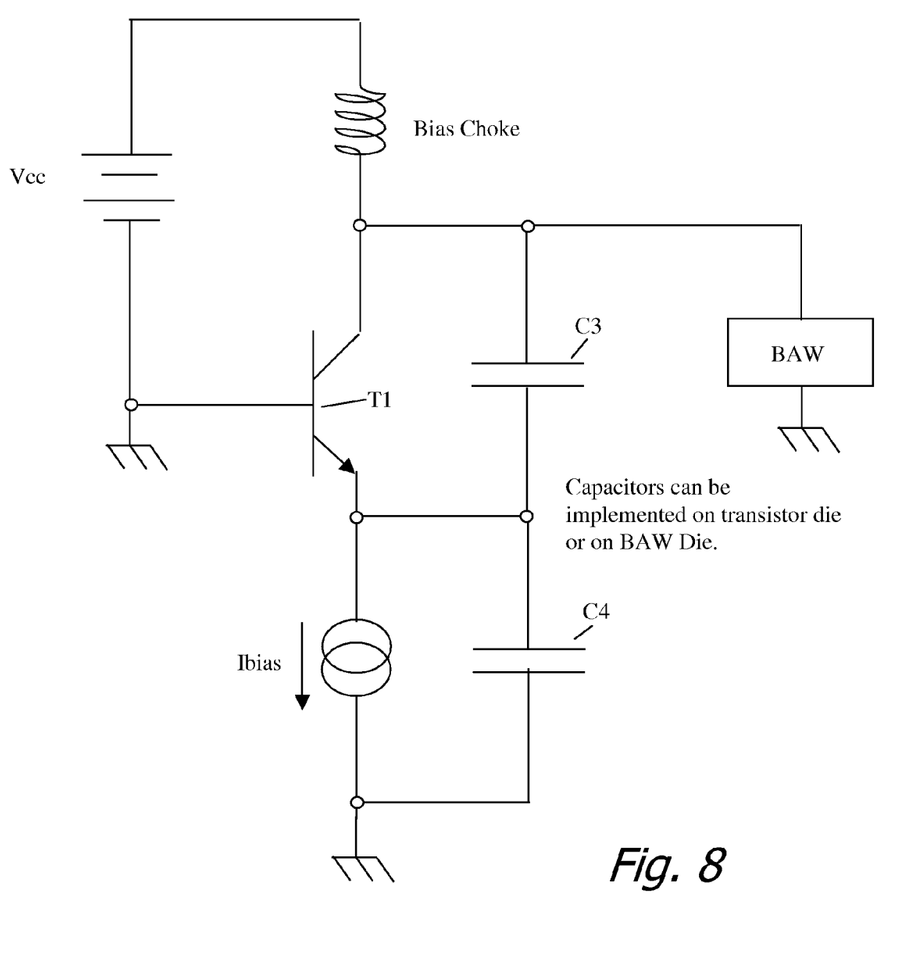
FIG. 8 is a Culprits oscillator circuit with BAW resonator.

Now referring to FIG. 8, a circuit for a Colpitts oscillator may be seen. As shall be subsequently described, this oscillator may be fabricated and packaged in accordance with the present invention, with various exemplary embodiments thereof to be described. The Colpitts oscillator includes a bias choke, two capacitors C3 and C4, transistor T1, a bias current source Ibias and a BAW resonator. The power supply VCC of course is provided as an input to the device. The bias choke or inductor is processed on the outside side of one of the wafers, with capacitor C3 and C4 being implemented either on a transistor die (typically silicon) or on a BAW die. In either case the capacitors may be conventional metal-insulator-metal (MIM) structures, or particularly on the BAW die, may be capacitors using a piezoelectric material such as AlN for the insulator, with the resulting resonator structure of course being tuned so as to not exhibit any resonances at the frequency of oscillation of the Colpitts oscillator.

Figure 9:
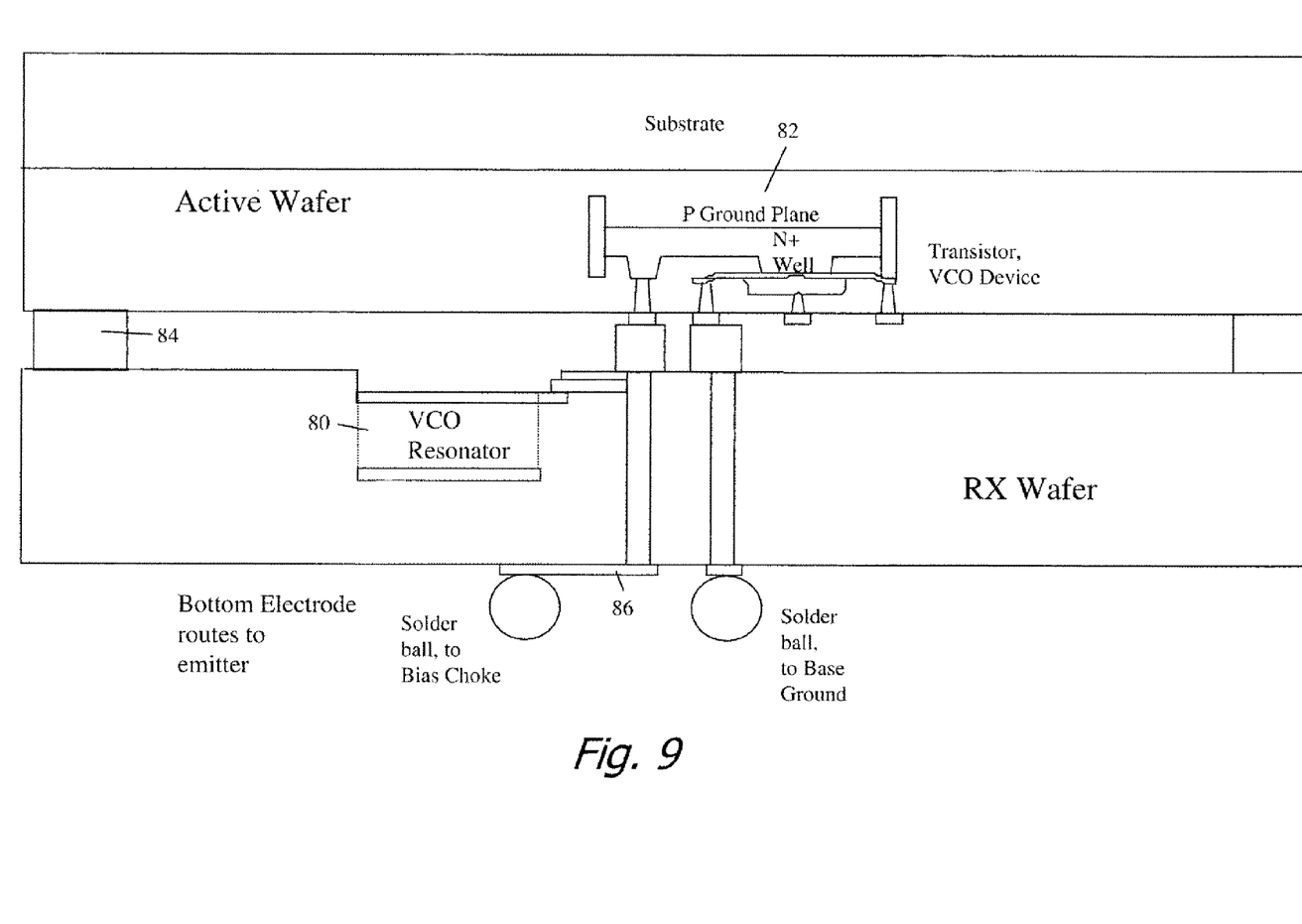
FIG. 9 is a cross-section example of a Culprits VCO on bonded resonator wafers plus active wafer, showing collector and base routing.
Figure 10:
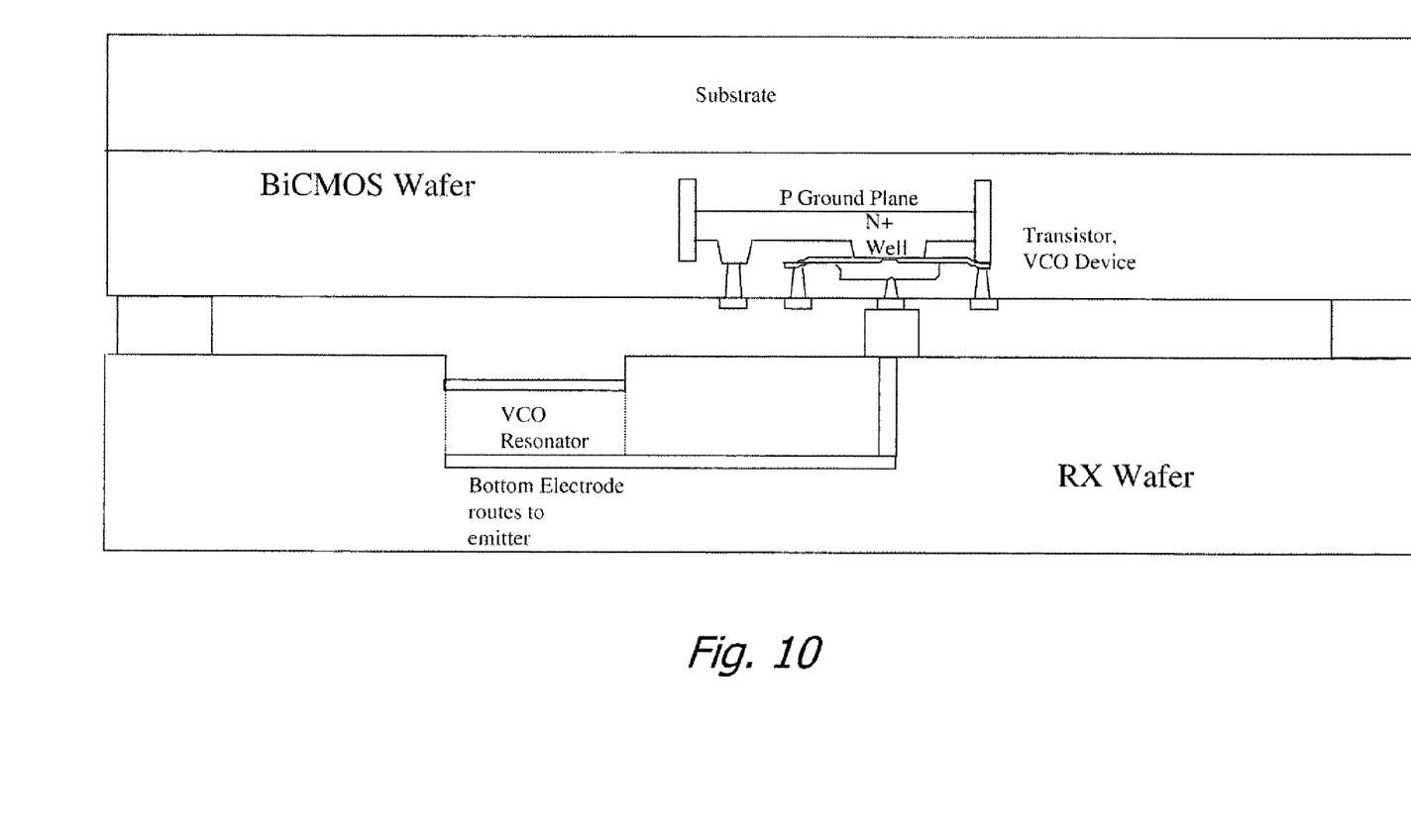
FIG. 10 is a cross-section example of Colpitts VCO on bonded resonator wafers plus BiCMOS die, showing emitter routing.

An implementation of such an oscillator, or at least exemplary portions thereof, is illustrated in FIG. 9. Here a receive wafer is bonded to a BiCMOS wafer on a substrate. In this embodiment the receive wafer includes the Colpitts oscillator or VCO resonator 80, and of course, may include other components such as, particularly, capacitors C3 and C4 of FIG. 8. The transistor 82 for the Colpitts oscillator or VCO device is fabricated in the BiCMOS wafer, with the two wafers being bonded together by bonding ring 84. The bias choke of FIG. 8 may be formed in metalization layer 86. As stated before, the capacitors C3 and C4 of FIG. 8, not specifically shown in FIG. 9, may be metal-insulator-metal capacitors or BAW resonator structures tuned so as to have no resonances at the frequency of oscillation of the oscillator. Of course, in FIG. 9 various parts of the Colpitts oscillator, as well as various contacts thereof which are in accordance with the external contact of FIG. 8, are not specifically illustrated. Actually FIG. 9 illustrates the collector and base routing for the Colpitts VCO, with FIG. 10 illustrating the emitter routing for the Colpitts VCO. Those skilled in the art can easily replace the BiCMOS wafer with different wafers such as CMOS and add components such as variable capacitors to change the frequency of operation.

Figure 11:
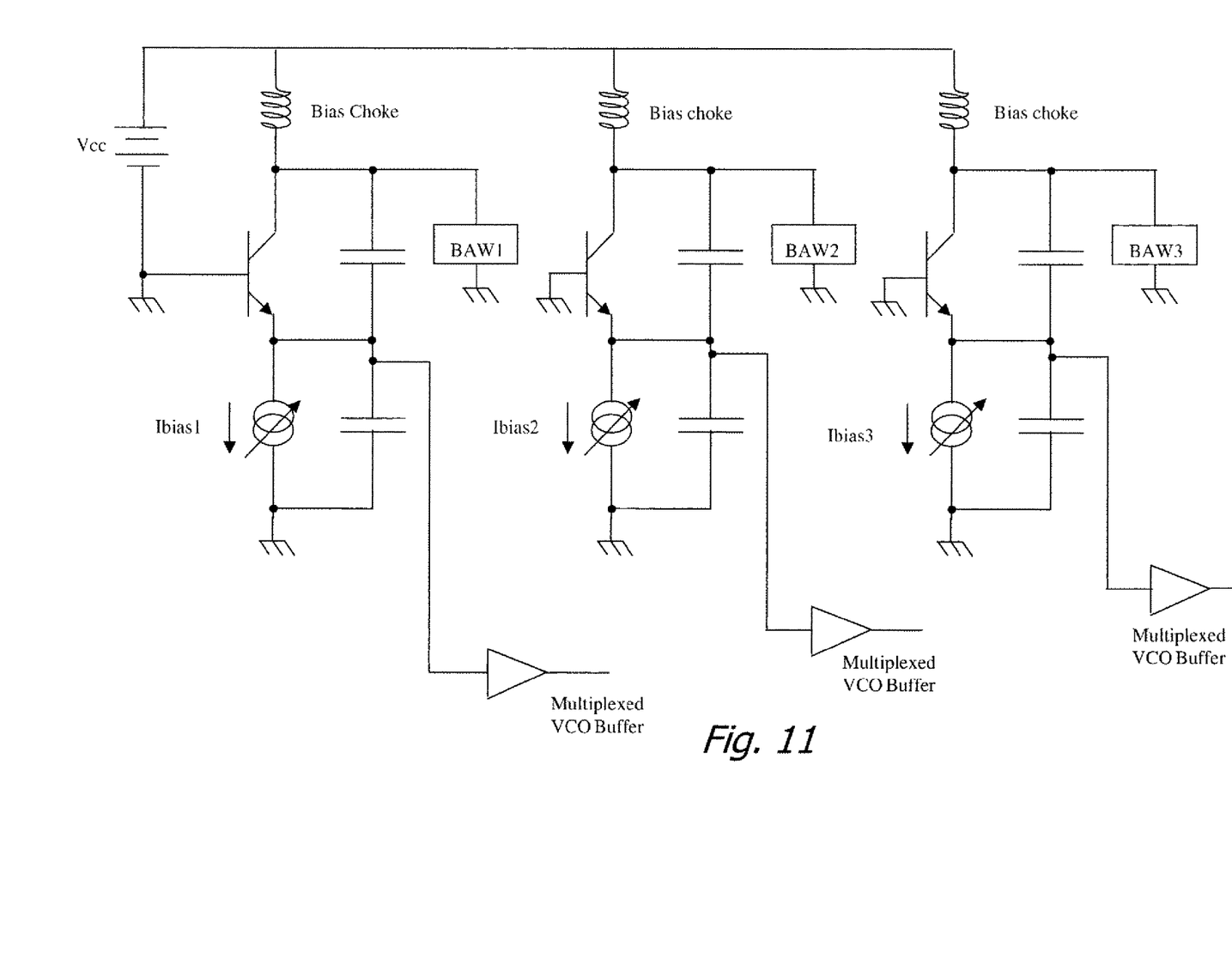
FIG. 11 shows multiple Colpitts oscillators using multiple BAW resonator with trim values for Fp.

FIG. 11 is a diagram of multiple Colpitts oscillators using multiple BAW resonator trim values for the frequency of oscillation. Such multiple Colpitts oscillators of course may be fabricated as illustrated, by way of example, in FIGS. 9 and 10. The multiplex VCO buffer may be an external buffer, or alternatively, may also be formed on the BiCMOS wafer of FIGS. 9 and 10.

Figure 12:
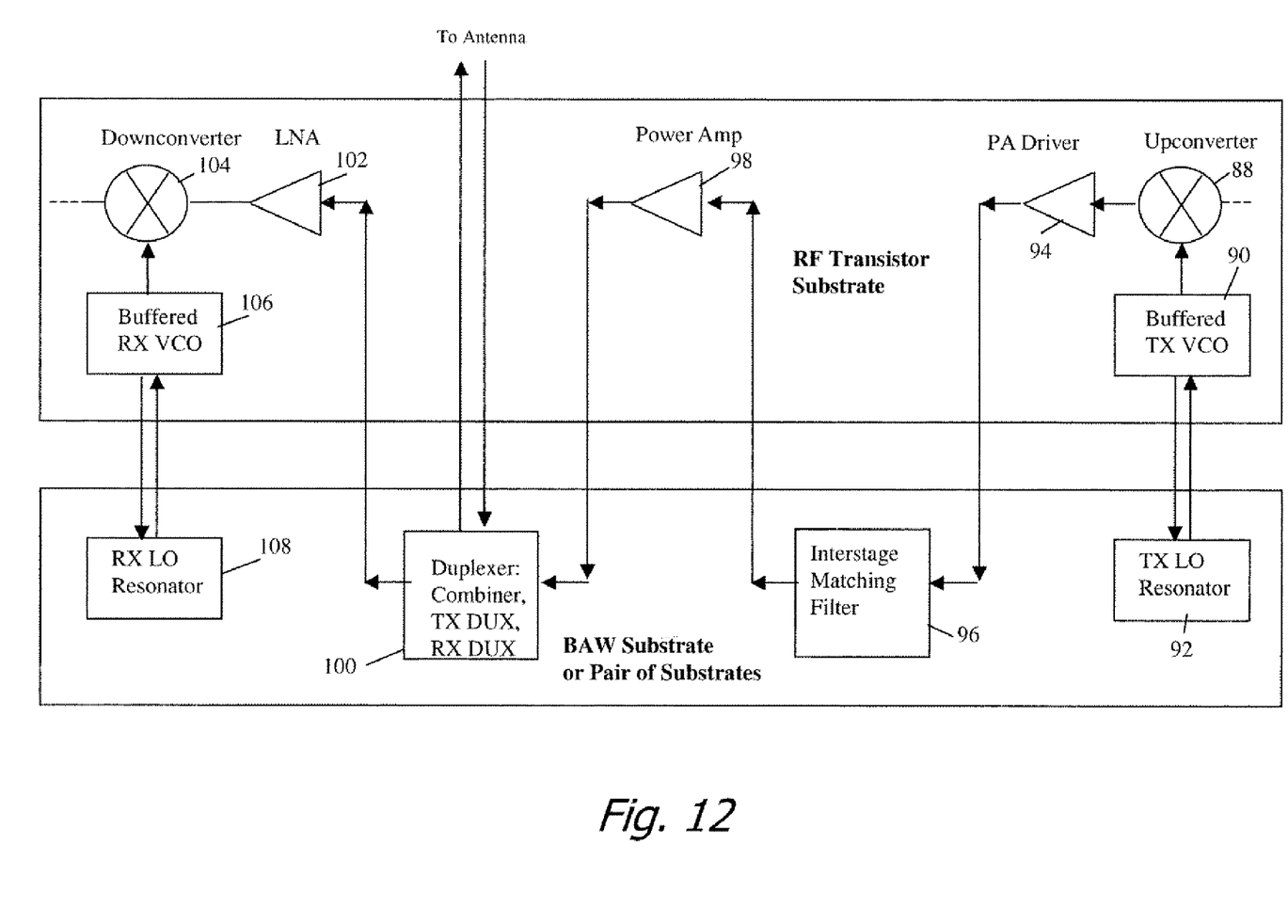
FIG. 12 shows a method of combining multiple RF blocks with multiple BAW filters and/or resonators on bonded wafers.

The extent of integration achievable with the present invention in any single device or module is limited only by the imagination of the designer and the yield of the resulting product. By way of example, FIG. 12 illustrates a device combining multiple RF blocks with multiple BAW filters and resonators in a single package. The particular package illustrated is a two wafer package having a BAW substrate (or a pair of substrates) and an RF transistor substrate. In such a package the signal flow may pass from the transistor substrate to the BAW substrate, and vice versa, a number of times for the desired function. In this case, the proposed circuit optimizes the loss of the filter while obtaining the required rejection, yielding lower power consumption than prior art. In particular, an input signal which may be a baseband signal is provided to upconverter 88 for converting the input signal to the desired RF frequency using a buffered VCO 90 coupled to a transmit local oscillator resonator 92. The output of the upconverter 88 is coupled to a power amplifier driver 94 on the transistor substrate, the output of which in turn is coupled to an interstage matching filter 96 on the BAW substrate. The output of the interstage matching filter 96 is coupled to power amplifier 98 on the transistor substrate, the output of which is then coupled to the transmit side of the duplexer 100 for coupling to the antenna. The filter includes a duplexer/combiner (duplexer) 100, which alternatively may be on the transistor substrate, which controls the coupling of the antenna between the transmit and receive signal paths. During reception the duplexer and receive filters provide a receive signal to the low noise amplifier 102 on the transistor substrate, with the RF signal output thereof being provided to low noise amplifier 102 and from there to downconverter 104 on the transistor substrate using a reference signal from buffered VCO 106 reference to local oscillator resonator 108 on the BAW substrate. The downconverter may convert the signal to baseband or to an IF frequency, as desired. As an alternative to the foregoing, a third wafer may be used, such as a gallium arsenide wafer as in FIG. 7, namely, a gallium arsenide wafer for the power amplifier.

There have been described herein exemplary embodiments of wafer scale packaged, single package duplexers. Though the exemplary embodiments have been described with respect to duplexers, it should be understood that duplexers are only exemplary, as other circuits may be similarly packaged. Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A bonded wafer package comprising:
   first and second wafers bonded together forming a matrix of sealed devices, at least one of the wafers having a plurality of passive devices formed thereon, including at least one BAW resonator within each of the sealed devices;
   the first wafer having conductor filled through-holes forming electrical connections between the passive devices and connections assessable from outside the sealed devices;
   the bonded wafers being diced to form individual sealed devices.

2. The bonded wafer package of claim 1 wherein one wafer is a silicon wafer and one wafer includes a piezoelectric film.

3. The bonded wafer of claim 2 wherein the silicon wafer includes a plurality of active devices thereon.

4. The bonded wafer of claim 3 wherein the active devices include transistors.

5. The bonded wafer package of claim 4 wherein the transistors comprise a multi-stage power amplifier whose individual gain stages connect to individual resonator stages to optimize system noise and filter loss.

6. The bonded wafer package of claim 4 wherein the transistors comprise at least one of a low noise amplifier and a power amplifier.

7. The bonded wafer package of claim 6 wherein the plurality of passive devices and the plurality active devices comprise a duplexer.

8. The bonded wafer package of claim 2 wherein the piezoelectric film is an AlN film.

9. The bonded wafer package of claim 8 wherein the plurality of passive devices include at least one capacitor.

10. The bonded wafer package of claim 9 wherein the at least one capacitor is on the AlN wafer, and comprises an insulator between two conductive plates, the insulator being an AlN insulator, thereby forming a BAW device tuned to not be resonant for frequencies of signals applied to the capacitor.

11. The bonded wafer package of claim 1 wherein both wafers have a plurality of passive devices formed thereon; and further comprising electrical contacts bonded between the first and second wafers to make electrical contact with passive devices on the second wafer.

12. The bonded wafer package of claim 1 further comprised of a third wafer bonded to the second wafer, the third wafer having active devices thereon, and further comprising electrical contacts bonded between the first and second wafers to make electrical contact with passive devices on the second wafer, and bonded between the second and third wafers to make electrical contact with passive devices on the third wafer.

13. The bonded wafer package of claim 12 wherein the third wafer is a silicon wafer having transistors thereon.

14. The bonded wafer package of claim 13 wherein the plurality of passive devices form a duplexer, inductors for the duplexer being formed by conductive traces on one surface of the bonded wafer package, and wherein the transistors form a low noise amplifier and a power amplifier.

15. The bonded wafer package of claim 14 wherein the transistors also form at least one of a: variable gain amplifier, upconverter, downconverter, power amplifier driver, and RF switch.

16. The bonded wafer package of claim 13 wherein the plurality of passive devices form a duplexer, inductors for the duplexer being formed by conductive traces on one surface of the bonded wafer package.

17. The bonded wafer package of claim 1 further comprising electrical contacts bonded between the first and second wafer to make electrical contact with devices on the second wafer.

18. The bonded wafer package of claim 17 further comprised of a third wafer bonded to the second wafer, one of the second and third wafers being a silicon wafer with low noise amplifier thereon and the other of the second and third wafers being a GaAs wafer with a power amplifier thereon, and further comprising electrical contacts bonded between the first and second wafers to make electrical contact with devices on the second wafer, and bonded between the second and third wafers to make electrical contact with devices on the third wafer.

19. The bonded wafer package of claim 1 wherein each of the BAW resonators face a cavity in the opposite wafer.

20. The bonded wafer package of claim 1 wherein at least one of the wafers has an active device formed therein, the passive devices and the active devices, together with at least one inductor formed by conductive traces on one surface of the bonded wafer package forming a voltage controlled oscillator circuit.

21. The bonded wafer package of claim 20 wherein the bonded wafer package comprises a plurality of voltage controlled oscillator circuits.

22. The bonded wafer package of claim 1 wherein one wafer is a wafer having active devices thereon and one wafer is a resonator wafer having BAW resonators thereon, and wherein the devices on the two wafers are interconnected to form a duplexer for coupling to an antenna, a transmit signal path including an up converter and power amplifier, and a receive signal path including a low noise amplifier and a down converter.

23. The bonded wafer package of claim 22 wherein each of the transmit and receive signal paths include a local oscillator resonator in a voltage controlled oscillator circuit.

24. The bonded wafer package of claim 23 wherein the transmit signal path further comprises a power amplifier driver and an interstage matching filter.

25. A bonded wafer package comprising:
first and second wafers bonded together forming a matrix of sealed devices, at least one of the wafers having a plurality of passive devices thereon forming duplexers, including a plurality of BAW resonators within each of the sealed devices, inductors for the duplexers being formed by conductive traces on one surface of the bonded wafer package;
the first wafer having conductor filled through-holes forming electrical connections between the passive devices and connections assessable from outside the sealed devices;
the bonded wafers being diced to form individual sealed devices.

26. The bonded wafer package of claim 25 wherein one wafer is a silicon wafer and one wafer includes an AlN film.

27. The bonded wafer of claim 26 wherein the silicon wafer includes a plurality of active devices thereon.

28. The bonded wafer package of claim 27 wherein the transistors comprise a low noise amplifier and a power amplifier.

29. The bonded wafer package of claim 28 wherein the transistors also form at least one of: variable gain amplifier, upconverter, downconverter, power amplifier driver, and RF switch.

30. The bonded wafer package of claim 26 wherein capacitors in the duplexers are on the wafer that includes the AlN film, and comprises an insulator between two conductive plates, the insulator being an AlN insulator, forming a BAW device tuned to not be resonant for frequencies of signals applied to the capacitor.

31. The bonded wafer package of claim 25 wherein both wafers have a plurality of passive devices formed thereon; and further comprising electrical contacts bonded between the first and second wafers to make electrical contact with passive devices on the second wafer.

32. The bonded wafer package of claim 25 further comprised of a third wafer bonded to the second wafer, the third wafer having active devices thereon, and further comprising electrical contacts bonded between the first and second wafers to make electrical contact with passive devices on the second wafer, and bonded between the second and third wafers to make electrical contact with passive devices on the third wafer.

33. The bonded wafer package of claim 32 wherein the third wafer is a silicon wafer having transistors thereon.

34. The bonded wafer package of claim 33 wherein the transistors form a low noise amplifier and a power amplifier.

35. The bonded wafer package of claim 33 herein wherein the transistors also form at least one of: variable gain amplifier, upconverter, downconverter, power amplifier driver, and RF switch.

36. The bonded wafer package of claim 25 further comprising electrical contacts bonded between the first and second wafers to make electrical contact with devices on the second wafer.

37. The bonded wafer package of claim 36 further comprised of a third wafer bonded to the second wafer, one of the second and third wafers being a silicon wafer with low noise amplifier thereon and the other of the second and third wafers being a GaAs wafer with a power amplifier thereon, and further comprising electrical contacts bonded between the first and second wafers to make electrical contact with devices on the second wafer, and bonded between the second and third wafers to make electrical contact with devices on the third wafer.

38. The bonded wafer package of claim 25 wherein each of the BAW resonators face a cavity in the opposite wafer.

* * * * *